(12) United States Patent
Gorbachov et al.

(10) Patent No.: US 10,574,190 B2
(45) Date of Patent: Feb. 25, 2020

(54) RF POWER AMPLIFIERS WITH DIODE LINEARIZER

(71) Applicant: SKYWORKS SOLUTIONS, INC., Woburn, MA (US)

(72) Inventors: Oleksandr Gorbachov, Irvine, CA (US); Lisette L. Zhang, Irvine, CA (US); Lothar Musiol, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 27 days.

(21) Appl. No.: 15/148,167

(22) Filed: May 6, 2016

(65) Prior Publication Data

US 2016/0329866 A1 Nov. 10, 2016

Related U.S. Application Data

(60) Provisional application No. 62/157,896, filed on May 6, 2015.

(51) Int. Cl.
| | | |
|---|---|---|
| *H03F 1/30* | (2006.01) | |
| *H03F 1/32* | (2006.01) | |
| *H03F 3/193* | (2006.01) | |
| *H03F 1/34* | (2006.01) | |

(52) U.S. Cl.
CPC .......... *H03F 1/3205* (2013.01); *H03F 1/342* (2013.01); *H03F 3/193* (2013.01); *H03F 2200/126* (2013.01); *H03F 2200/15* (2013.01); *H03F 2200/225* (2013.01); *H03F 2200/391* (2013.01); *H03F 2200/451* (2013.01)

(58) Field of Classification Search
CPC ........ H03F 1/3205; H03F 3/245; H03F 1/565; H03F 1/342; H03F 3/193

USPC ................... 330/290, 149, 296, 297
See application file for complete search history.

(56) References Cited

U.S. PATENT DOCUMENTS

| | | | | |
|---|---|---|---|---|
| 4,118,731 A | * | 10/1978 | Hinn ...................... | H04N 9/648 348/809 |
| 5,138,275 A | | 8/1992 | Abbiati et al. | |
| 5,374,899 A | * | 12/1994 | Griffiths ................ | H03F 3/1935 330/277 |
| 5,589,797 A | | 12/1996 | Gans et al. | |

(Continued)

OTHER PUBLICATIONS

Bera, S.C.; Bharadwaj, P.S.; Singh, R.V.; Garg, V.K.; "A Diode Linearizer for Microwave Power Amplifiers"; Microwave Journal; Horizon House Publications, Nov. 2003.

(Continued)

*Primary Examiner* — Khanh V Nguyen
*Assistant Examiner* — Khiem D Nguyen
(74) *Attorney, Agent, or Firm* — Stetina Brunda Garred & Brucker

(57) ABSTRACT

A radio frequency (RF) power amplifier circuit with a diode linearizer circuit. The power amplifier circuit has an input and an output, as well as a power amplifier transistor with a first terminal connected to the input, a second terminal connected to the output, and a third terminal. The linearizer circuit is connected to the third terminal and to ground, and has a non-linear current-voltage curve as well as a non-linear capacitance. The linearizer circuit reduces inter-modulation products in a current through the power amplifier transistor from the second terminal to the third terminal that corresponds to an input signal applied to the input.

22 Claims, 12 Drawing Sheets

(56) References Cited

U.S. PATENT DOCUMENTS

| 6,316,983 | B1 | 11/2001 | Kitamura |
| 6,414,545 | B1 | 7/2002 | Zhang |
| 6,509,789 | B1 | 1/2003 | Ciemniak |
| 6,882,227 | B2 | 4/2005 | Barry et al. |
| 6,946,908 | B1 | 9/2005 | Sun et al. |
| 2002/0097094 | A1 | 7/2002 | Wang et al. |
| 2012/0242405 | A1 | 9/2012 | Chung et al. |

OTHER PUBLICATIONS

Katz, Allen; "TWTA Linearization"; Linearizer Technology, Inc.; www.lintech.com, Jan. 7, 2000.

Hashmi, M.S.; Rogojan, Z.S.; Ghannouchi, F.M.; "A Flexible Dual-Inflection Point RF Predistortion Linearizer for Microwave Power Amplifiers"; Progress in Electromagnetics Research C; vol. 13, 1-18, 2010.

Mrunal A.K.; Shirasgaonkar, Makarand, Patrikar, R.M.; "Power Amplifier Linearization Using Diode on Voltage"; : Electrotechnical Conference, MELECON, IEEE Mediterranean, May 2006.

Noh, Youn Sub; Park, Chul Soon; "PCS/W-CDMA Dual Band MMIC Power Amplifier with a Newly Proposed Linearizing Bias Circuit"; IEEE Journal of Solid-State Circuits, vol. 37, No. 9, Sep. 2002.

Jeong, Hee-Young; Park, Sang-Keun; Ryu, Nam-Sik; Jeong, Yong-Chae; Yom, In-Bok; Kim, Young; A Design of K-band Predistortion Linearizer using Reflective Schottky Diode for Satellite TWTAs; 35th European Microwave Conference, Paris, 2005.

Fox, J.; Mastorides, T.; Teytelman, D.; Van Winkle, D.; Zhou, Y.; Klystron Linearizer for use with 1.2 MS 476 MHZ Klystrons in Pep-II RF Systems; U.S. Particle Accelerator Conference, May 2005.

Turkel, Bilge; Caglar, Mehmet Fatih; "Linearized 2.4 GHz Power Amplifier"; Progress in Electromagnetics Research Symposium Proceedings, Malaysia, Mar. 2012.

225 MHz to 3800MHz RF Power Amplifier Linearizer (RFPAL); Maxim Integrated; www.maximintegrated.com, Dec. 2014.

Haskins, Christopher B.; "Diode Predistortion Linearization for Power Amplifier RFICs in Digital Radios"; Virginia Polytechnic Institute and State University, Apr. 17, 2000.

International Search Report and Written Opinion for Application Serial No. PCT/US2016/031309; dated Aug. 11, 2016.

* cited by examiner

RF POWER AMPLIFIERS WITH DIODE LINEARIZER

CROSS-REFERENCE TO RELATED APPLICATIONS

This application relates to and claims the benefit under 35 U.S.C. § 119(e) to U.S. Provisional Patent Application No. 62/157,896 filed May 6, 2015 and entitled "RF POWER AMPLIFIERS WITH DIODE LINEARIZER," the entire contents of which is wholly incorporated herein by reference.

STATEMENT RE: FEDERALLY SPONSORED RESEARCH/DEVELOPMENT

Not Applicable

BACKGROUND

1. Technical Field

The present disclosure relates generally to radio frequency (RF) integrated circuits, and more particularly, to RF power amplifiers with diode linearizers.

2. Related Art

Generally, wireless communications involve an RF carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System) W-CDMA (Wideband Code Division Multiple Access). More recently, 4G (fourth generation) technologies such as LTE (Long Term Evolution), which is based on the earlier GSM and UMTS standards, are being deployed. Besides these mobile communications modalities, local area data networking modalities such as Wireless LAN (WLAN)/WiFi, WiMax, and so forth.

A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals.

The output of the transmitter is connected to a power amplifier, which amplifies the RF signals prior to transmission via the antenna. The receiver is connected to the output of a low noise amplifier, the input of which is connected to the antenna and receives inbound RF signals. A transmit/receive switch selectively interconnects the antenna to the output of the power amplifier during transmission, and to the input of the low noise amplifier during reception. Thus, the power amplifier, the low noise amplifier, and the antenna switch serves as key building blocks in RF transceiver circuitry. These components may be referred to as a front end circuit.

In most wireless communications such as the aforementioned WCDMA and 3G/4G cellular, it is important for the RF power amplifier to have high efficiency, as well as minimal distortion as characterized in terms of error vector magnitude (EVM), adjacent channel power ratio (ACPR) and so forth. Particularly in recent multiple-input multiple-output (MIMO) systems common in mobile devices, extremely low EVM is desirable so that dynamic long duration burst mode operation is possible. High efficiency RF power amplifiers such as class F, inverse class F, class E, and Doherty amplifiers, however, all exhibit non-linear performance because of lower gate bias voltages when implemented with complementary metal oxide semiconductor (CMOS) technology.

Accordingly, there is a need in the art for improved high efficiency, low distortion power RF power amplifiers. In particular, there is a need for linearizer networks to compensate for gain and phase deviation while maintaining high efficiency over a wide output power and frequency range.

BRIEF SUMMARY

The present disclosure is directed to various embodiments of diode-based linearizer network for RF power amplifiers. A decrease of 3 to 6 dB is contemplated over a wide frequency band and output power. In particular, a feedback diode network controls the biasing voltage and the bias resistance of a feed-forward diode network at the gate of the RF power amplifier transistor, and accordingly, compensates for the positive gain and negative phase deviation of typical class F power amplifiers. The significant reduction of the asymmetry of third order intermodulation (IMD3) is also contemplated in accordance with the various embodiments of the present disclosure.

According to various embodiments, an RF power amplifier circuit with an input and an output is disclosed. There may be a power amplifier transistor with a first terminal connected to the input, a second terminal connected to the output, and a third terminal. The RF power amplifier circuit may also include a linearizer circuit connected to the third terminal and to ground. The linearizer circuit may have a non-linear current-voltage curve as well as a non-linear capacitance. The linearizer circuit reduces inter-modulation products in a current through the power amplifier transistor from the second terminal to the third terminal that corresponds to an input signal applied to the input.

The various embodiments of the present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of power amplifier circuits and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
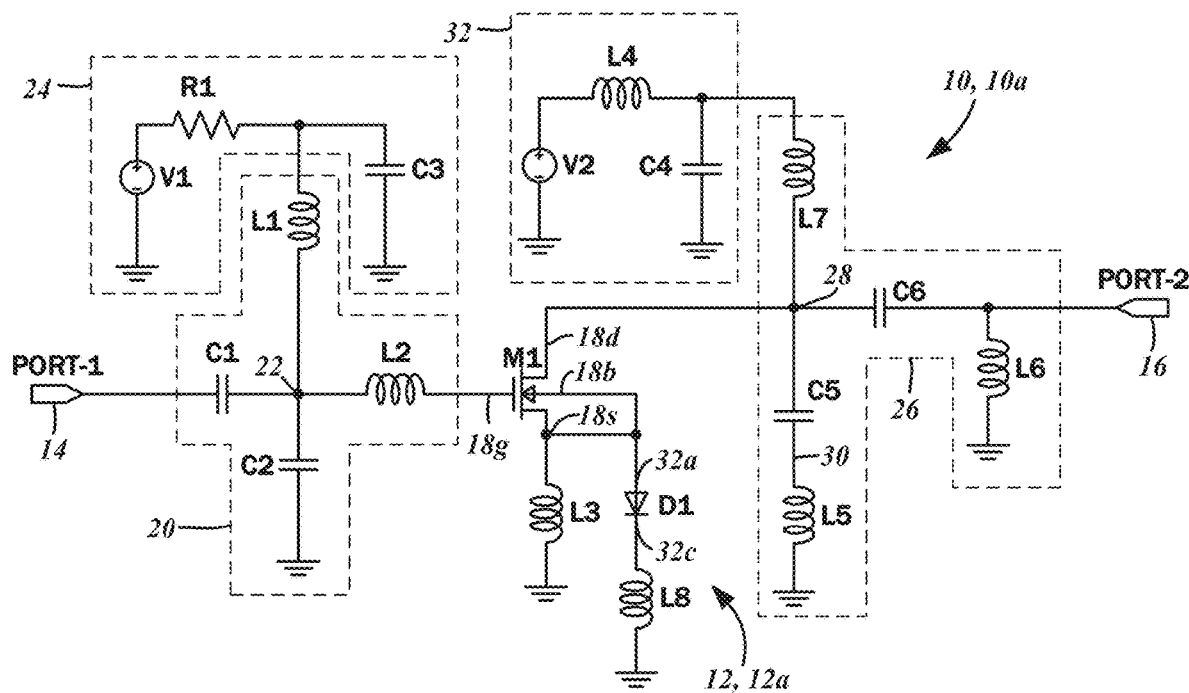
FIG. 1 is a schematic diagram of a first embodiment of an RF power amplifier including a first variant of a diode linearizer.

FIG. 1 shows a first embodiment 10a of an RF power amplifier circuit with a diode linearizer circuit 12. Generally, the RF power amplifier circuit 10 is defined by an input port 14 on which an RF signal is received, an output port 16 from which the amplified RF signal is output, and a single stage amplifier transistor M1. The present disclosure is directed to different configurations of the diode linearizer circuit 12, and so these variations will be described in the context of the basic RF power amplifier circuit 10 as shown.

It will be appreciated by those having ordinary skill in the art that the single stage configuration utilizing the one n-channel metal oxide semiconductor (NMOS) transistor is by way of example only and not of limitation, and any other suitable alternative configuration of the power amplifier circuit may be substituted without departing from the present disclosure. Along these lines, the transistor M1 need not be the depicted NMOS type, and the various embodiments of the present disclosure may be substituted with bipolar junction transistors, or any other type of transistor and fabrication technologies. The transistor M1, as an NMOS type, has a gate terminal 18g, a drain terminal 18d, a source terminal 18s, and a body terminal 18b. When utilizing other types of transistors, the terminals thereof, e.g., base, collector, emitter, are understood to correspond to the gate, drain, and source terminal, respectively. Accordingly, reference to one type one transistor terminal herein is understood to also refer to the corresponding terminal on a different type of transistor.

In further detail, the RF power amplifier circuit 10 includes an input matching circuit 20 connected to the input port 14 and to the gate terminal 18g of the transistor M1. The input matching circuit 20 is generally comprised of a capacitor C1, capacitor C2, an inductor L1, and an inductor L2, each of which are connected to each other at a node 22. These components are tuned to impedance match the transistor M1 to an RF signal source connected to the input port 14. The capacitor C1 is also connected to the input port 14, the capacitor C2 is connected to ground, and the inductor L2 is connected to the gate terminal 18g. There is a control voltage circuit 24 comprised of a control voltage V1, a resistor R1, and an RF decoupling capacitor C3. The control voltage V1 is applied to the gate terminal 18g of the transistor M1 through the resistor R1 to establish a particular bias point. Although a simple bias control circuit implementation is shown, it will be recognized that any suitable implementation may be utilized. The inductor L1 is thus connected to the control voltage circuit 24, and specifically the control voltage V1 through the resistor R1. The aforementioned RF decoupling capacitor C3 therefore isolates the bias/control voltage V1 from the RF signal path.

The source terminal 18s of the transistor M1 is connected to an inductor L3, which in turn is connected to ground. Thus, the transistor M1 is in a negative feedback configuration. The body terminal 18b is tied to the source terminal 18s. In one embodiment, the inductor L3 is a bond wire, though this is by way of example only.

The transistor M1 is also connected to an output matching circuit 26 comprised of a capacitor C5, a capacitor C6, an inductor L5, and inductor L6, and an inductor L7. The output matching circuit 26, in turn, is connected to the output port 16, and impedance matches the transistor M1 to the component connected to the output port 16, which may be an antenna. The drain terminal 18d of the transistor M1 is connected to a node 28, to which the capacitor C5, the capacitor C6, and the inductor L7 are connected. The inductor L5 is connected in series with the capacitor C5, and to ground. Specifically, the inductance value of the inductor L6 and the capacitance value of the capacitor C5 are selected to define a series resonant circuit at the second harmonic of the operating frequency of the input RF signal. As will be pertinent to other embodiments of the RF power amplifier circuit 10 described below, a junction 30 defines the connection between the inductor L5 and the capacitor C5. The capacitor C6 is connected to the inductor L6 and to the output port 16.

The drain terminal 18d of the transistor M1 is also connected to a bias circuit 32 comprised of a bias voltage V2, and a low pass filtering circuit defined by the inductor L4 and the capacitor C4. Additionally, the capacitor C4 serves RF decoupling functions to isolate the RF signal at the drain terminal 18d of the transistor M1 from the bias voltage V2.

With the foregoing configuration of the RF power amplifier circuit 10, an RF signal applied to the input port 14 is amplified by the transistor M1 and output from the output port 16. Furthermore, the various embodiments of the diode linearizer circuits 12 of the present disclosure may be utilized in connection with the basic configuration of the RF power amplifier circuit 10 as described above. Without the contemplated diode linearizer circuits 12, the RF power amplifier circuit is understood to exhibit third order intermodulation distortion (IM3) products of about −40 dBc across a wide range of input power levels (−10 dBm to +2 dBm). These levels of IM3 distortion may be adequate for WiFi OFDM (Orthogonal Frequency Division Multiplex) signals with a 20 MHz to 40 MHz bandwidth, as a IM3 of −40 dBc corresponds to approximately 1% error vector magnitude (EVM). This is also adequate for WiFi/802.11ac signals with 256QAM (Quadrature Amplitude Modulation). The use of the contemplated diode linearizer circuit 12 is for further reduction of IM3 products as suitable for multi-user MIMO (multiple-in, multiple-out) WiFi systems without the need to increase amplifier transistor quiescent current. Indeed, while this approach may be workable in HBT (heterojunction bipolar transistor) GaAs (gallium arsenide) or SiGe (silicon germanium) circuits if a reduction in overall efficiency is acceptable, but may not be practical for CMOS (complementary metal oxide semiconductor) power amplifier circuits where IM3 products cannot be reduced because of the associated lower breakdown voltage and punch-through effects.

As shown in the schematic diagram of FIG. 1, the first embodiment of the RF power amplifier circuit 10a includes the diode linearizer circuit 12. A first embodiment 12a is comprised of a diode D1, with an anode 32a thereof connected to the source terminal 18s of the transistor M1. The cathode 32c of the diode D1 is connected in series with an inductor L8 that is connected to ground. The inductor L8, however, may be bond wire in some embodiments. When the RF power amplifier circuit 10 is operating, that is, the transistor M1 is on, and an RF input signal applied to the input port 14 is being amplified and output through the output port 16, an RF voltage is induced between the source terminal 18s of the transistor M1 and ground. This is due to the non-zero impedance of the inductor L3, and the same voltage is induced between the anode 32a of the diode D1 and ground. Furthermore, the RF current through the source terminal 18s of the transistor M1 passes through a parallel circuit of the inductor L3 in one branch, and the series-connected diode D1 and the inductor L8 in another branch, to ground. It is noted that no additional direct current or voltage is applied to between the anode 32a and the cathode 32c of the diode D1.

Because of the non-linear characteristics of the diode D1, current through the transistor M1 between the drain terminal 18d and the source terminal 18s is envisioned to have less inter-modulation products, particularly where the geometric size of the diode D1 is appropriately selected. This corresponds to a reduction in intermodulation products at the output port 16. The non-linear I-V (current-voltage) characteristics, as well as the non-linear capacitance of the diode D1 is understood to yield this reduction in intermodulation products. Other embodiments of the diode linearizer circuit 12 may utilize different types of diodes, including those based upon the metal oxide semiconductor of the transistor M1.

Figure 2:
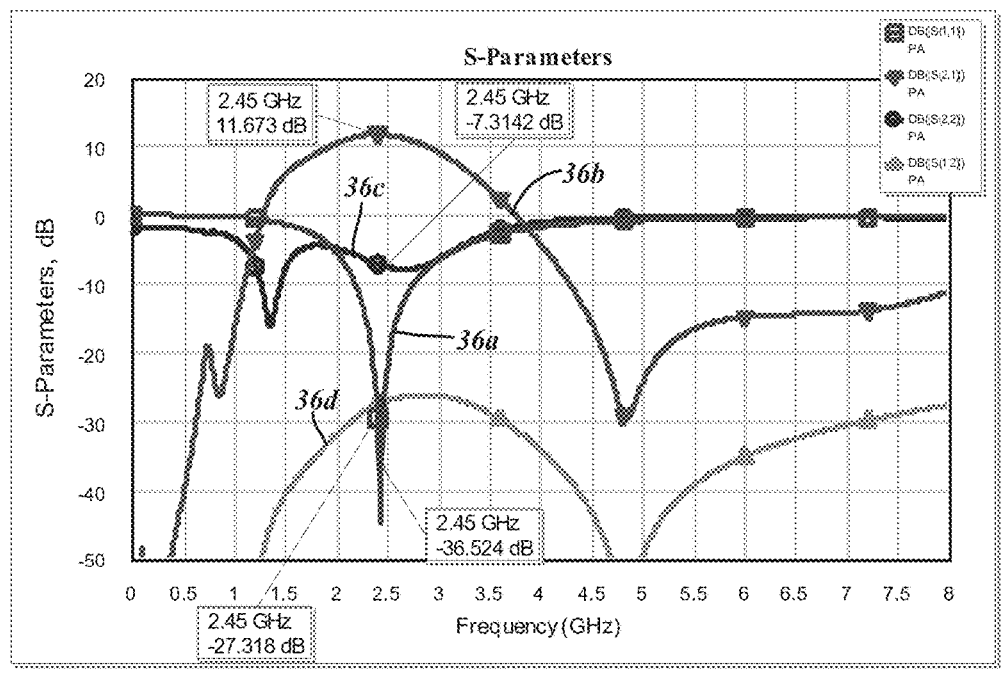
FIG. 2 is a graph plotting the scattering parameters (S-parameters) of the first embodiment of the RF power amplifier with the diode linearizer depicted in FIG. 1.

The graph of FIG. 2 plots simulated small-signal scattering parameters (S-Parameters) versus frequency of the first embodiment of the RF power amplifier circuit 10a, with particular focus on the 2.4 GHz ISM (industrial-scientific-medical) band. A first plot 36a shows an input port return loss (S11), while a second plot 36b shows the amplifier gain (S21). Furthermore, a third plot 36c shows the output port return loss (S22), and a fourth plot 36d shows the reverse isolation (S12). The simulation results for the first embodiment of the RF power amplifier circuit 10a with the first embodiment of the diode linearizer circuit 12a are understood to be the same or very similar to as without.

Figure 3A:
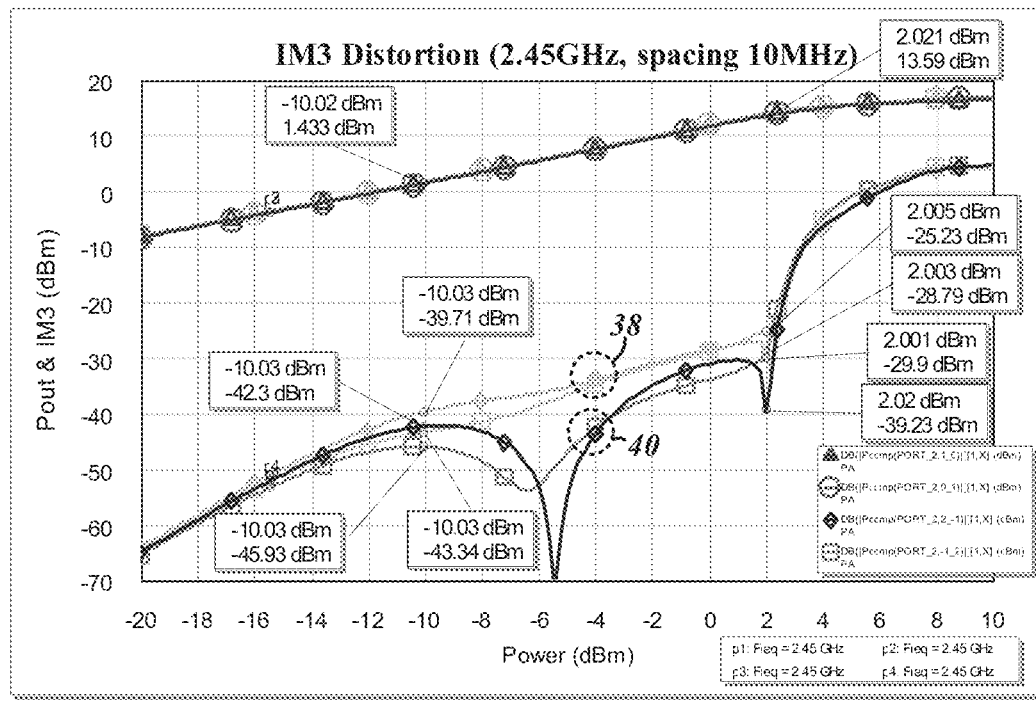
FIG. 3A is a graph plotting the third order intermodulation distortion (IM3) of the first embodiment of the RF power amplifier with the diode linearizer depicted in FIG. 1 with a first diode size.

FIG. 3A is a graph plotting the simulated IM3 distortion at the 2.4 GHz ISM frequency band over a range of input power for the first embodiment of the RF power amplifier circuit 10a including the first embodiment of the diode linearizer circuit 12a. A first plot 38 shows the IM3 products without the diode linearizer circuit 12a, and a second plot 40 showing a corresponding reduction in the IM3 products when the diode linearizer circuit 12a is used. More particularly, the simulation is based upon a relative diode area of 0.2 (relative to transistor M1 active area), and the bond wire inductors L3 and L8 each have an inductance value of 0.35 nH. The simulations with and without the diode linearizer circuit 12 are otherwise based upon the same component values, as well as the same biasing conditions. As shown, there is a minimum reduction of 4 to 5 dB of IM3 products at high power levels where the input power is lower than 2 dBm.

Figure 3B:
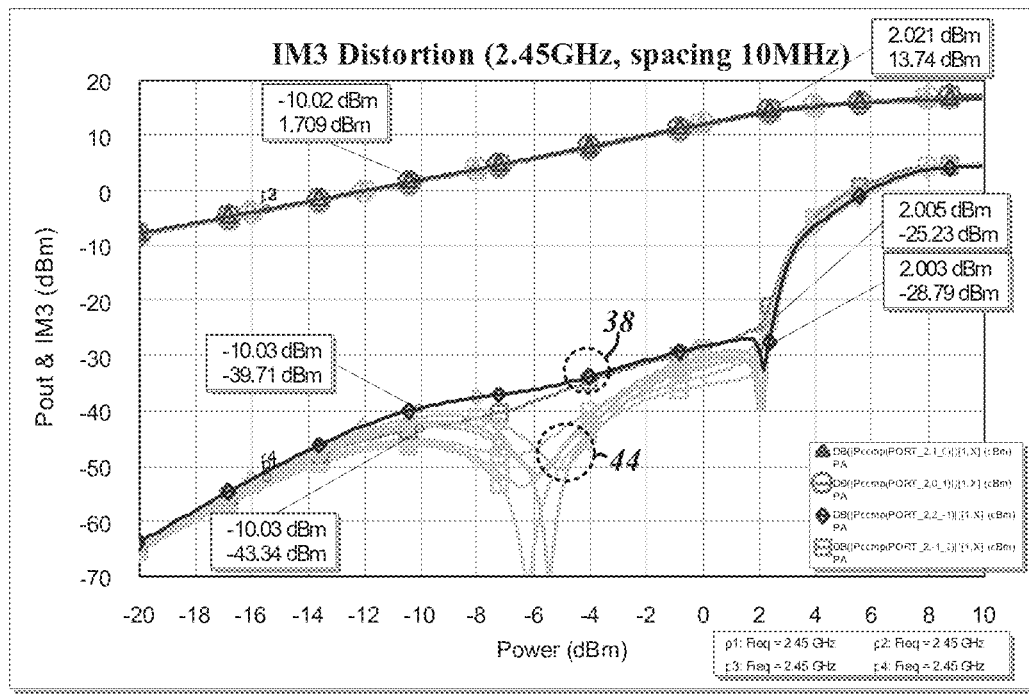
FIG. 3B is a graph plotting IM3 distortion of the first embodiment of the RF power amplifier with the diode linearizer depicted in FIG. 1 with a second diode size.

The graph of FIG. 3B likewise plots the simulated IM3 distortion at the 2.4 GHz ISM frequency for the first embodiment of the RF power amplifier circuit 10a. However, different size diodes were simulated, in particular, relative areas of 0.15, 0.2, and 0.25. The first graph plot 38 shows the IM3 products without the diode linearizer circuit 12a, and a second plot 44 shows the reduced IM3 products with the aforementioned differently sized diodes.

Figure 4:
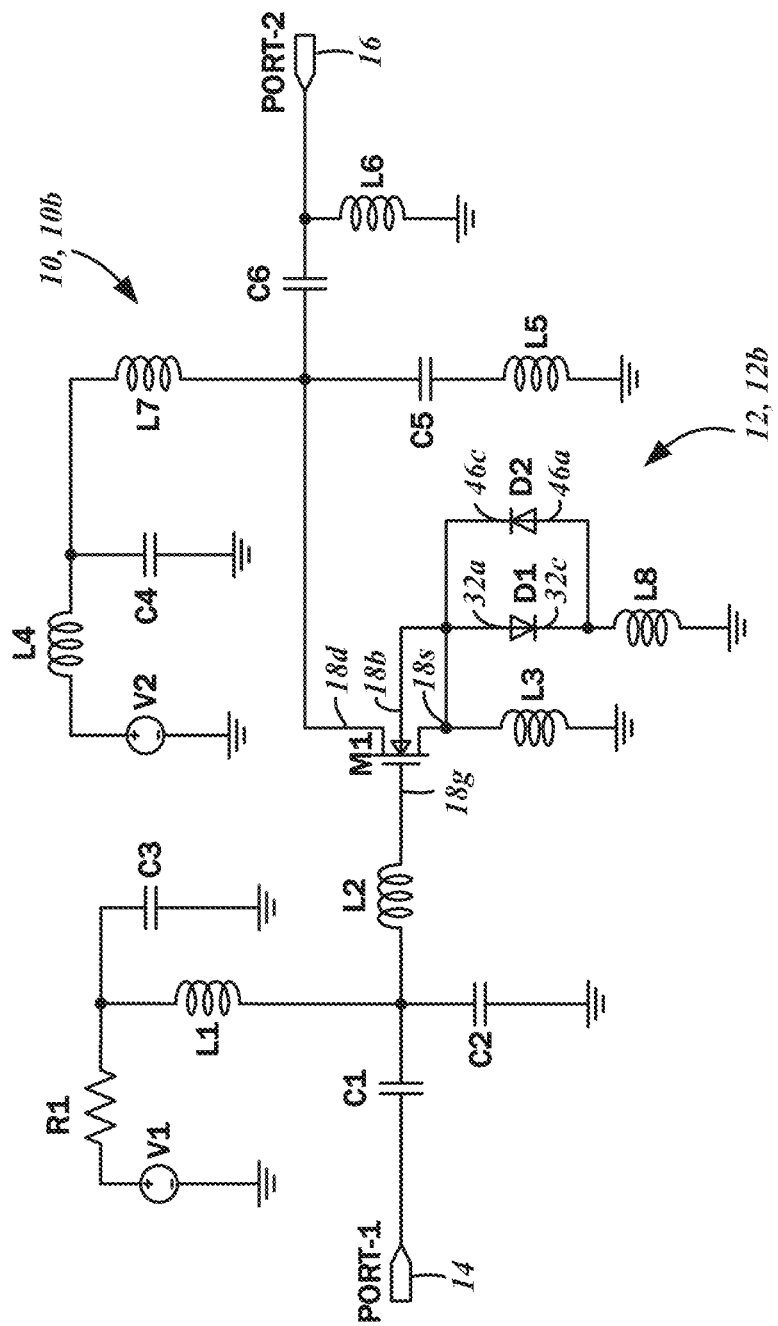
FIG. 4 is a schematic diagram of a second embodiment of the RF power amplifier with a second variant of the diode linearizer.

FIG. 4 is a schematic diagram of a second embodiment of the RF power amplifier circuit 10b including a second embodiment of the diode linearizer circuit 12b. Because the basic components of the RF power amplifier circuit 10b, that is, the single stage amplifier transistor M1, along with the input matching circuit, output matching circuit, the control voltage circuit, and the bias circuit are the same as in the first embodiment of the RF power amplifier circuit 10a, the details thereof will not be repeated for the sake of brevity.

The source terminal 18s of the transistor M1 is similarly connected to the inductor L3, along with the first diode D1 that is connected in series with the inductor L8 to ground. Additionally, however, the second embodiment of the diode linearizer circuit 12b includes a second diode D2 that is connected in anti-parallel to the first diode D1. The anode 32a of the first diode D1 is connected to the source terminal 18s (and also connected to the body terminal 18b), while the cathode 32c of the first diode D1 is connected to the inductor L8. An anode 46a of the second diode D2 is connected to the cathode 32c of the first diode D1 and the inductor L8. A cathode 46c of the second diode D2 is connected to the anode 32a of the first diode, and the source terminal 18s of the transistor M1. Again, no direct current bias voltage is connected to the first diode D1 or the second diode D2.

The RF current through the source terminal 18s of the transistor M1 passes through a parallel circuit of the inductor L3 in one branch, and the first diode D1, the second diode D2, and the inductor L8 in another branch, to ground. According to one embodiment, the first diode D1 has a different size than the second diode D2. The different distribution of current as between these chains is understood to result in different intermodulation products over input signal levels.

Figure 5:
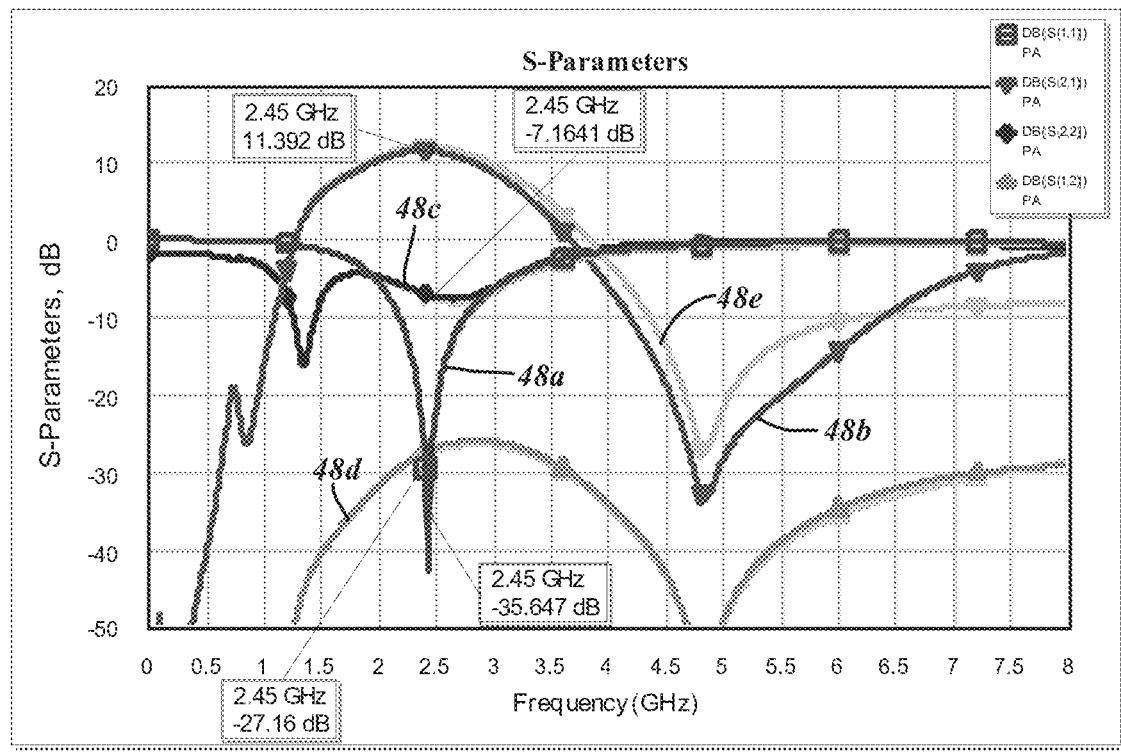
FIG. 5 is a graph plotting the S-parameters of the second embodiment of the RF power amplifier with the diode linearizer depicted in FIG. 4.

The graph of FIG. 5 plots simulated small-signal scattering parameters (S-Parameters) versus frequency of the second embodiment of the RF power amplifier circuit 10b, with particular focus on the 2.4 GHz ISM band. A first plot 48a shows an input port return loss (S11), and a second plot 48b shows the amplifier gain (S21). A third plot 48c shows the output port return loss (S22), and a fourth plot 48d shows the reverse isolation (S12). It is understood that there is a slight difference in small signal S-parameters at frequencies above the operating band. A fifth plot 48e is of the amplifier gain (S21) of the first embodiment of the RF power amplifier circuit 10b as a basis for comparing to the second plot 48b, that is, the performance of the RF power amplifier circuit 10 with and without the second diode D2.

Figure 6:
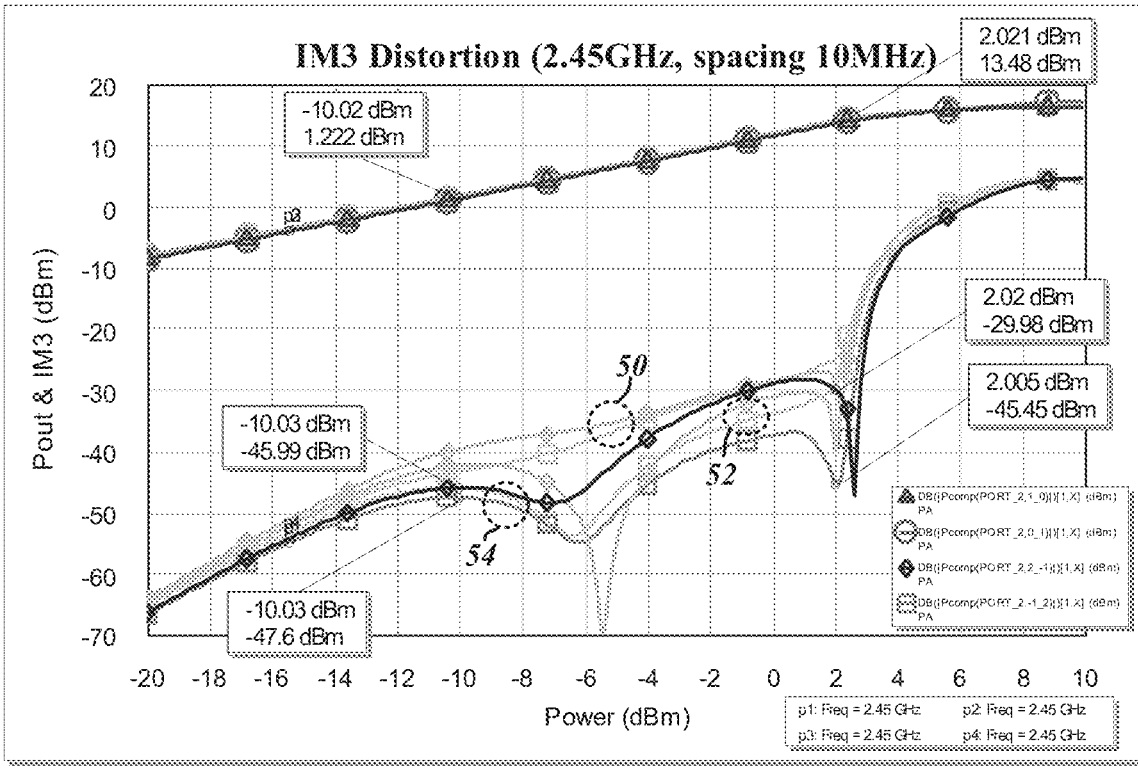
FIG. 6 is a graph plotting IM3 distortion of the second embodiment of the RF power amplifier with the diode linearizer depicted in FIG. 4.

FIG. 6 is a graph plotting the simulated IM3 distortion at the 2.4 GHz ISM frequency band over a range of input power for the second embodiment of the RF power amplifier circuit 10b including the second embodiment of the diode linearizer circuit 12b. A first plot 50 shows the IM3 products without the diode linearizer circuit 12b. A second plot 52 as well as a third plot 54 show a substantial reduction of IM3 products over a wide range of input power levels at the input port 14. The second plot 52 shows the IM3 products when the first diode D1 is utilized, whereas the third plot 54 shows the IM3 products when both the first diode D1 and the second diode D2 are utilized. In these examples, the reference size of the first diode D1 is 0.2, and the reference size of the second diode D2 is 0.15. In general, the shape and level of IM3 products are understood to be different between just the first diode D1, or both the first diode D1 and the second diode D2. Additional fine-tuning for particular power ranges is possible with the selection of different diode sizes in accordance with the present disclosure.

Figure 7:
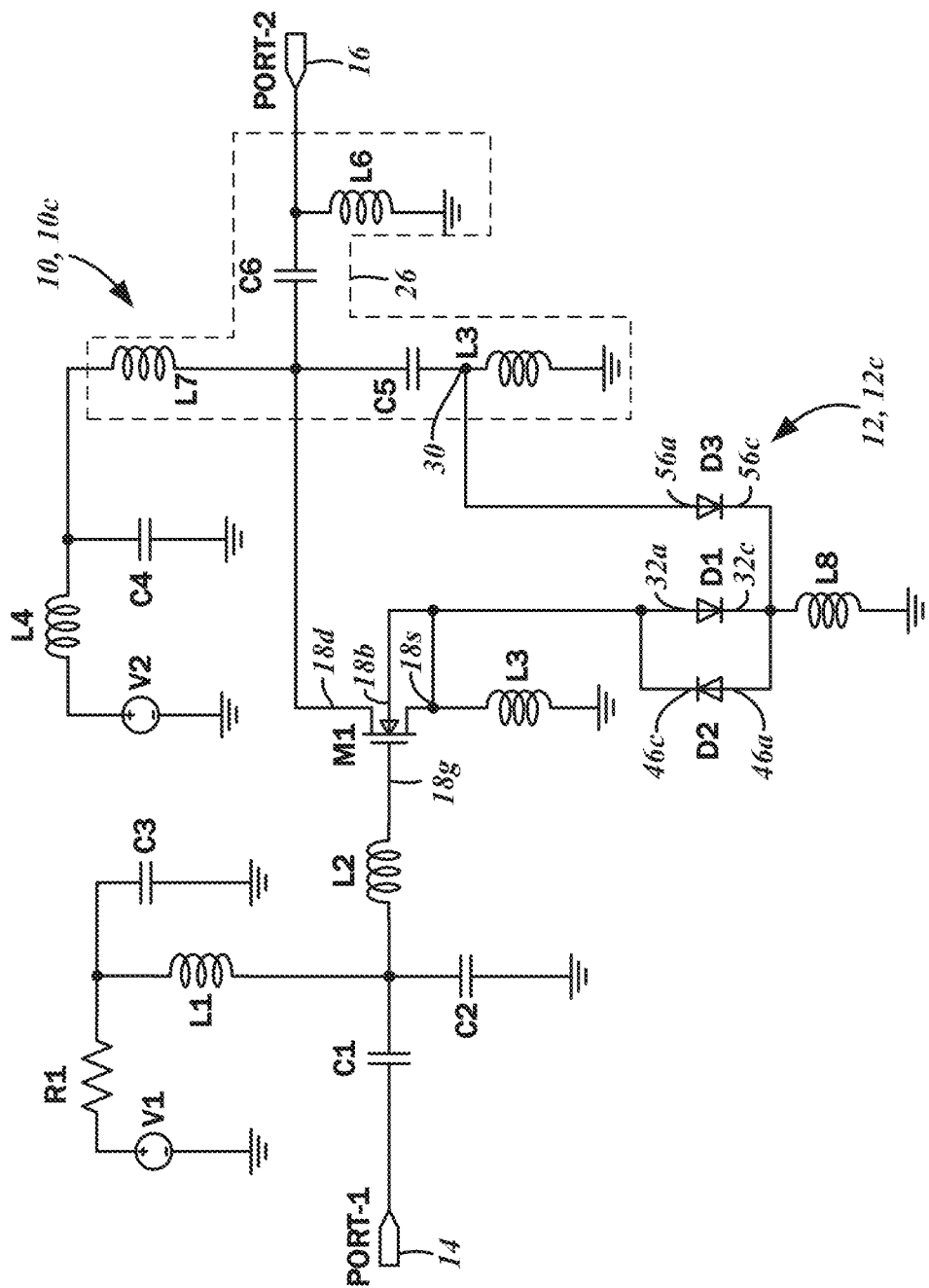
FIG. 7 is a schematic diagram of a third embodiment of the RF power amplifier with a third variant of the diode linearizer.

FIG. 7 is a schematic diagram of a third embodiment of the RF power amplifier circuit 10c including a third embodiment of the diode linearizer circuit 12c. Again, the basic components of the RF power amplifier circuit 10c, that is, the single stage amplifier transistor M1, along with the input matching circuit, output matching circuit, the control voltage circuit, and the bias circuit are the same as in the first and second embodiments of the RF power amplifier circuit 10a, 10b, described above.

The source terminal 18s of the transistor M1 is connected to the inductor L3, along with the first diode D1 that is connected in series with the inductor L8 to ground. Like the second embodiment of the diode linearizer circuit 12b described above, the third embodiment 12c also includes the second diode D2 connected in anti-parallel to the first diode D1. The anode 32a of the first diode D1 is connected to the source terminal 18s, and the cathode 32c of the first diode D1 is connected to the inductor L8. The anode 46a of the second diode D2 is connected to the cathode 32c of the first diode D1 and to the inductor L8. The cathode 46c of the second diode D2 is connected to the anode 32a of the first diode, and the source terminal 18s of the transistor M1.

Additionally, the third embodiment of the diode linearizer circuit 12c includes a third diode D3 that is connected to the inductor L8 and to the output matching circuit 26, specifically the junction 30 between the capacitor C5 and the inductor L3. An anode 56a of the third diode D3 is connected to the junction 30, and a cathode 56c of the third diode D3 is connected to the inductor L8. The third diode D3 induces a relatively large RF current to the junction between the first diode D1 and the inductor L8, close to the second harmonics of the input signal operating frequency. Accordingly, the third diode D3 configures the third embodiment of the RF power amplifier circuit 10c to function as a negative feedback circuit.

Again, no direct current bias voltage is connected to the first diode D1, the second diode D2, or the third diode D3. Furthermore, the first diode D1, the second diode D2 and the third diode D3 may each have different geometric dimensions/sizes.

The RF current through the source terminal 18s of the transistor M1 passes through a parallel circuit of the inductor L3 in one branch, and the first diode D1, the second diode D2, the third and the inductor L8 in another branch, to ground. Additionally, the third diode D3 induces additional current to the inductor L8 if the second harmonic voltage between the drain terminal 18d of the transistor M1 is high. Again, like in the first and second embodiments of the RF power amplifier circuit 10a, 10b, the different distribution of current as between these chains is understood to result in different intermodulation products over input signal levels.

Figure 8:
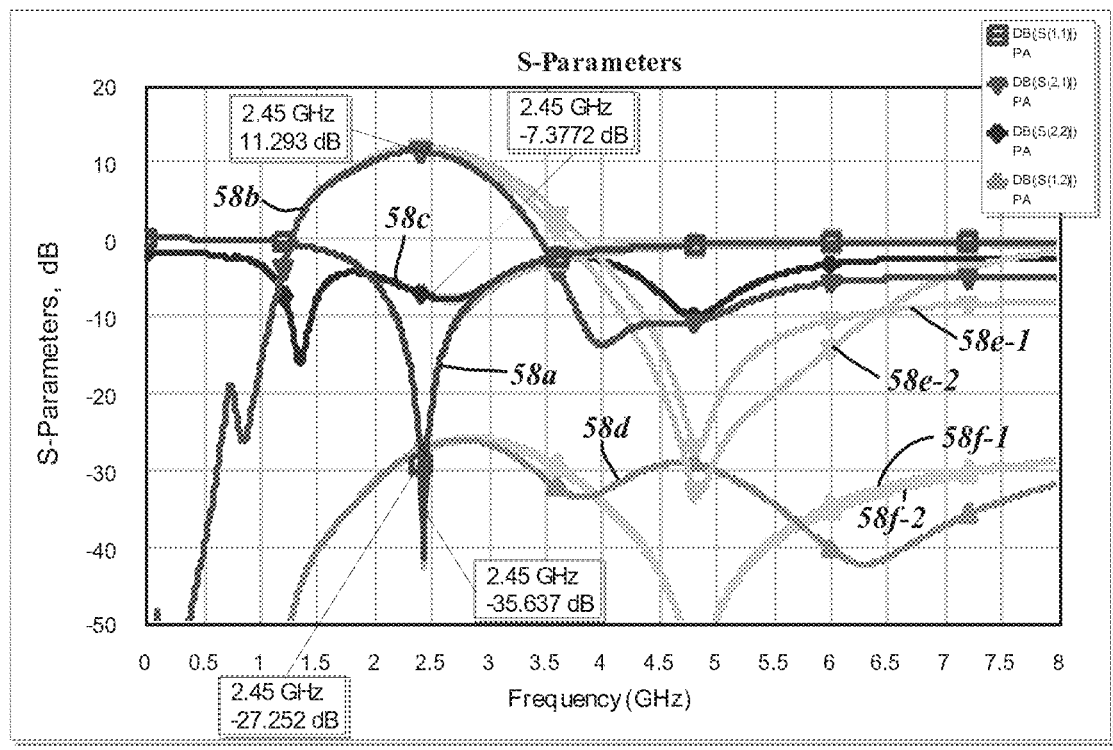
FIG. 8 is a graph plotting the S-parameters of the third embodiment of the RF power amplifier with the diode linearizer depicted in FIG. 7.

The graph of FIG. 8 plots simulated small-signal S-parameters versus frequency of the third embodiment of the RF power amplifier circuit 10c, with particular focus on the 2.4 GHz ISM band. A first plot 58a shows an input port return loss (S11), and a second plot 58b shows the amplifier gain (S21). A third plot 58c shows the output port return loss (S22), and a fourth plot 58d shows the reverse isolation (S12). There is a substantial difference in small signal S-parameters at frequencies above the operating band with the addition of the third diode D3 as described above. A first comparison plot 58e-1 and a second comparison plot 58e-2 show the amplifier gain (S21) of the first and second embodiments of the RF power amplifier circuit 10a, 10b as described above. Similarly, a third comparison plot 58f-1 and a fourth comparison plot 58f-2 show the reverse isolation S12 of the first and second embodiments of the RF power amplifier circuit 10a, 10b.

Figure 9:
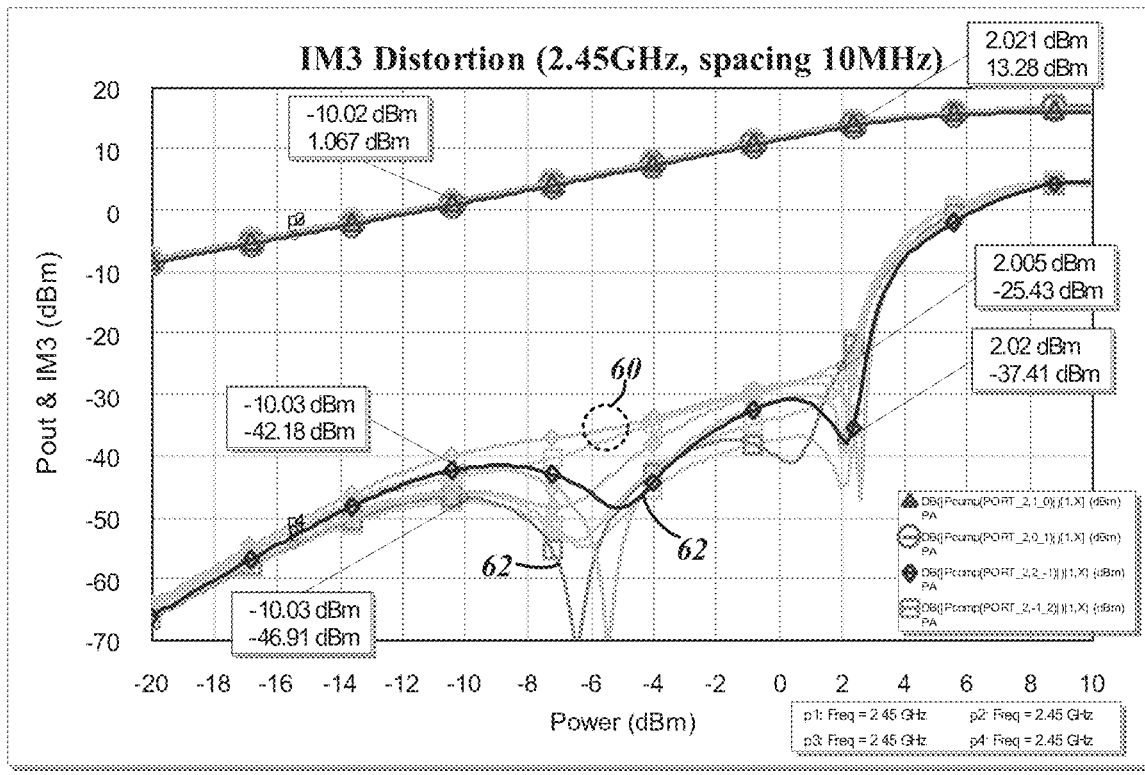
FIG. 9 is a graph plotting IM3 distortion of the third embodiment of the RF power amplifier with the diode linearizer depicted in FIG. 7.

The graph of FIG. 9 plots the simulated IM3 distortion at the 2.4 GHz ISM frequency band over a range of input power for the third embodiment of the RF power amplifier circuit 10c including the third embodiment of the diode linearizer circuit 12c. A first plot 60 shows the IM3 products without the diode linearizer circuit 12c. A series of plots 62 show a substantial reduction of IM3 products over a wide range of input power levels at the input port 14 when the first diode D1, the second diode D2, and the third diode D3 are utilized. In these examples, the reference size of the first diode D1 is 0.2, the reference size of the second diode D2 is 0.15, and the reference size of the third diode D3 is 0.25. In general, the shape and level of IM3 products are understood to be different between just the first diode D1, both the first diode D1 and the second diode D2, and all three of the first diode D1, the second diode D2, and the third diode D3. Additional fine-tuning for particular power ranges is possible with the selection of different diode sizes.

Figure 10:
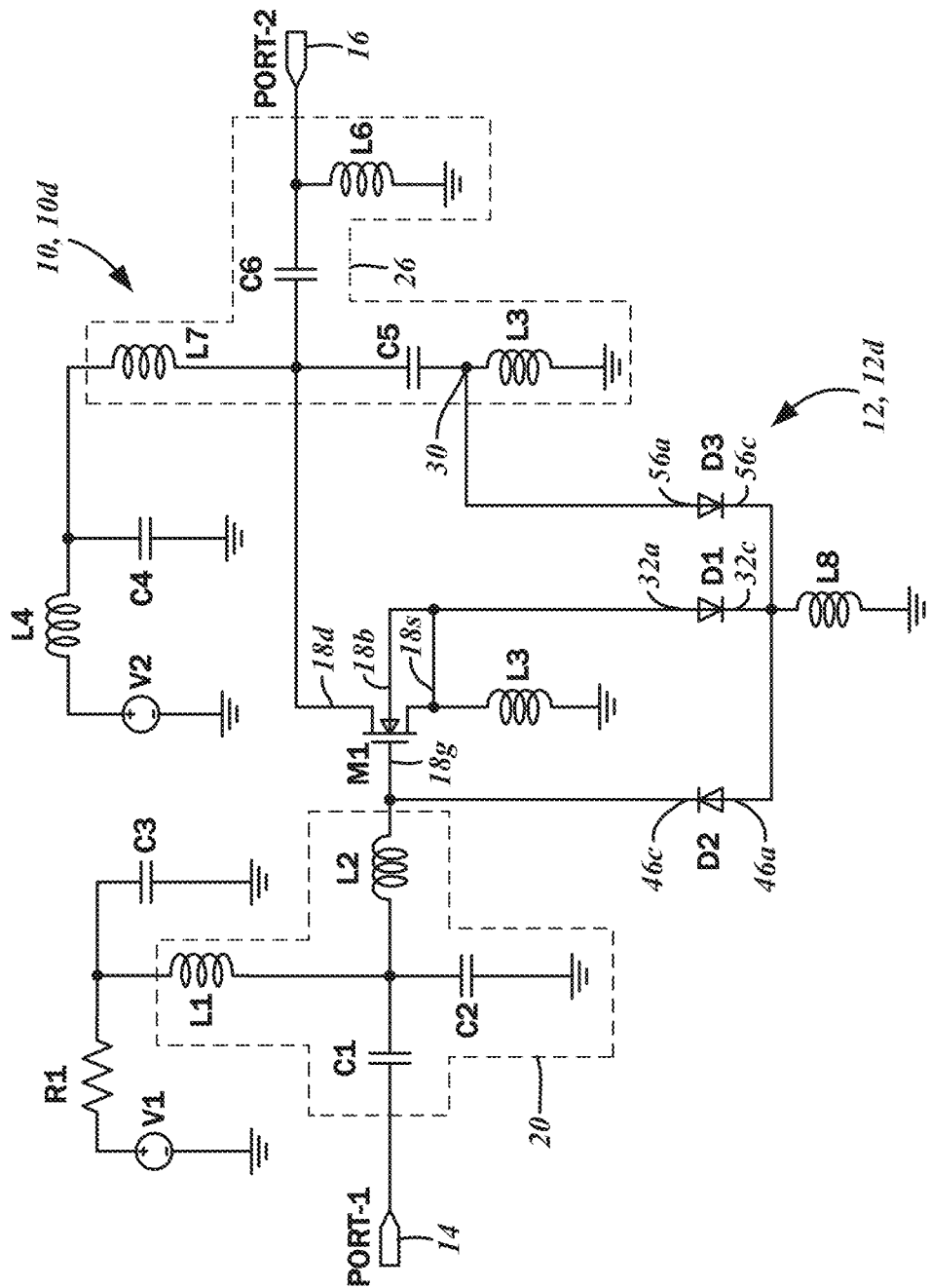
FIG. 10 is a schematic diagram of a fourth embodiment of the RF power amplifier with a fourth variant of the diode linearizer.

FIG. 10 shows a fourth embodiment of the RF power amplifier circuit 10d including a fourth embodiment of the diode linearizer circuit 12d. The basic components of the RF power amplifier circuit 10d, that is, the single stage amplifier transistor M1, along with the input matching circuit, output matching circuit, the control voltage circuit, and the bias circuit are the same as in the first, second, and third embodiments of the RF power amplifier circuit 10a, 10b, and 10c described above.

The source terminal 18s of the transistor M1 is connected to the inductor L3, along with the first diode D1 that is connected in series with the inductor L8 to ground. In comparison to the previously described embodiments that included the second diode D2, in the fourth embodiment of the diode linearizer circuit 12d, an alternative configuration is contemplated. Specifically, the second diode D2, that is, the cathode 46c thereof, is connected to the gate terminal 18g of the transistor M1. Thus, the direct current bias voltage V1 is applied to the cathode 46c of the second diode D2. As noted above, the input matching circuit 20, which is comprised of the capacitor C1, the capacitor C2, the inductor L1, and the inductor L2, is tuned to impedance match the gate terminal 18g of the transistor M1 to the RF signal source that is connected to the input port 14. With the introduction of the second diode D2 as a direct connection to the input port 14, according to certain embodiments of the present disclosure, the input matching circuit 20 is further tuned.

As with the configuration of the third embodiment 12c, in the fourth embodiment 12d, the anode 46a of the second diode D2 is connected to the cathode 32c of the first diode D1, the inductor L8, and the cathode 56c of the third diode D3. The anode 32a of the first diode D1 is likewise connected to the source terminal 18s of the transistor M1. The third diode D3 is connected to the inductor L8 and to the output matching circuit 26, specifically the junction 30 between the capacitor C5 and the inductor L3. The first diode D1, the second diode D2 and the third diode D3 may each have different geometric dimensions/sizes.

The RF current through the source terminal 18s of the transistor M1 passes through a parallel circuit to ground, through inductor L3, the first diode D1, and the inductor L8. The RF signal is understood to have different harmonics content at larger signal levels. The third diode D3 induces additional current to the inductor L8 if the second harmonic voltage between the drain terminal 18d of the transistor M1 is high. Further, a part of the input signal from the gate terminal 18g of the transistor M1 is applied to the inductor L8 though the second diode D2. Again, like in the first, second, and third embodiments of the RF power amplifier circuit 10a, 10b, 10c, the different distribution of current as between these chains is understood to result in different intermodulation products over input signal levels.

Figure 11:
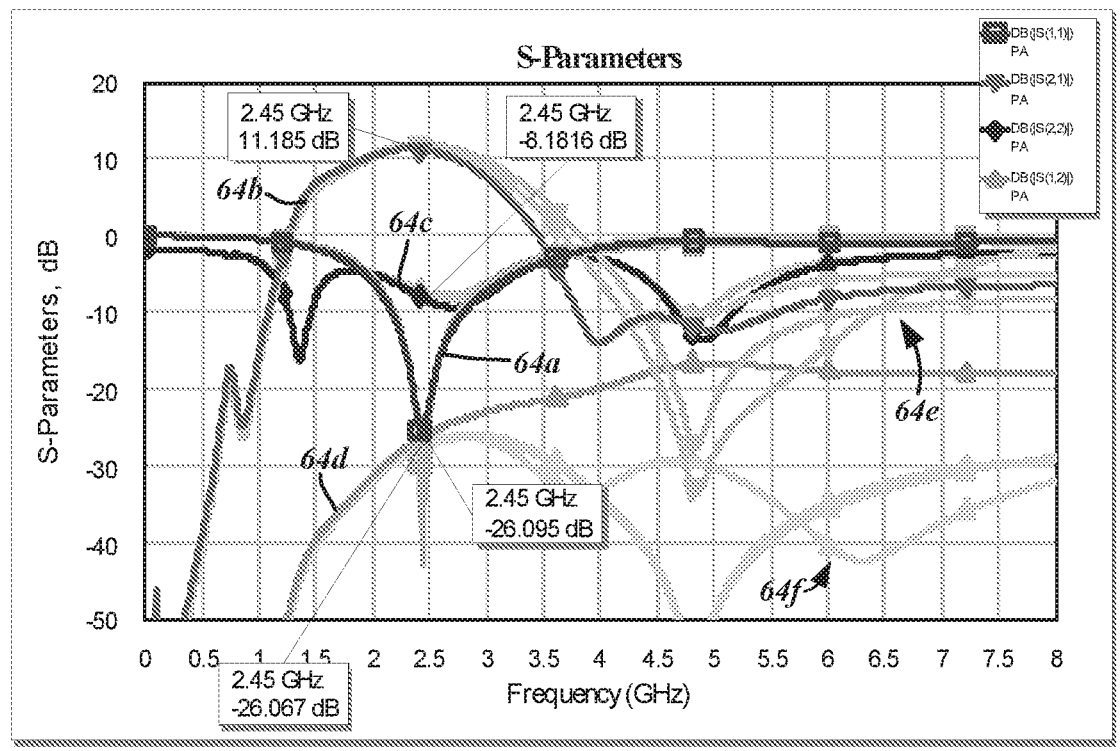
FIG. 11 is a graph plotting the S-parameters of the fourth embodiment of the RF power amplifier with the diode linearizer depicted in FIG. 10.

The graph of FIG. 11 plots simulated small-signal S-parameters versus frequency of the fourth embodiment of the RF power amplifier circuit 10d, with particular focus on the 2.4 GHz ISM band. A first plot 64a shows an input port return loss (S11), and a second plot 64b shows the amplifier gain (S21). A third plot 64c shows the output port return loss (S22), and a fourth plot 64d shows the reverse isolation (S12). There is a substantial difference in small signal S-parameters at frequencies above the operating band with the configuration of the fourth embodiment of the diode linearizer circuit 12d described above. Comparison plots 64e show the amplifier gain (S21) of the first, second and third embodiments of the RF power amplifier circuit 10a-10c as described above. Similarly, another set of comparison plots 64f show the reverse isolation S12 of the first, second, and third embodiments of the RF power amplifier circuit 10a-10c.

Figure 12:
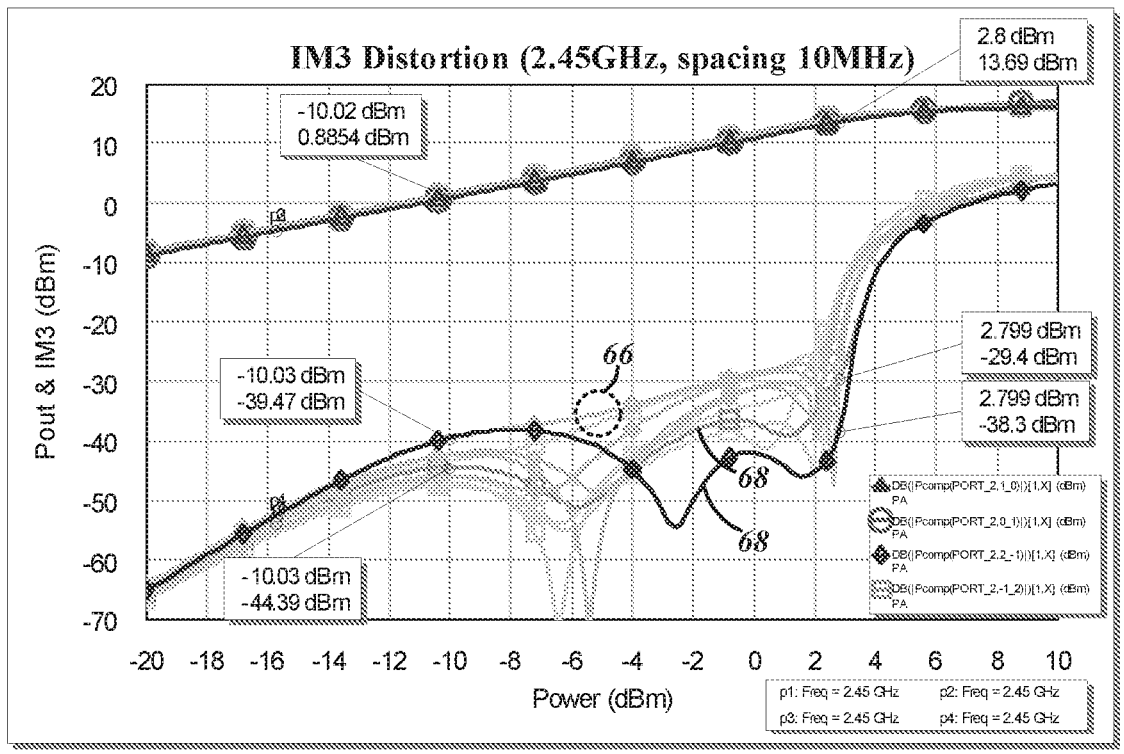
FIG. 12 is a graph plotting IM3 distortion of the fourth embodiment of the RF power amplifier with the diode linearizer depicted in FIG. 10.

FIG. 12 is a graph plotting the simulated IM3 distortion at the 2.4 GHz ISM frequency band over a range of input power for the fourth embodiment of the RF power amplifier circuit 10d including the fourth embodiment of the diode linearizer circuit 12d. A first plot 66 shows the IM3 products without the diode linearizer circuit 12d. A series of plots 68 show a substantial reduction of IM3 products over a wide range of input power levels at the input port 14 when the first diode D1, the second diode D2, and the third diode D3 are utilized. In these examples, the impedance of the input port 14 was 35 Ohm. Again, the shape and level of IM3 products are understood to be different between just the first diode D1, both the first diode D1 and the second diode D2, and all three of the first diode D1, the second diode D2, and the third diode D3. Additional fine-tuning for particular power ranges is possible with the selection of different diode sizes.

Figure 13:
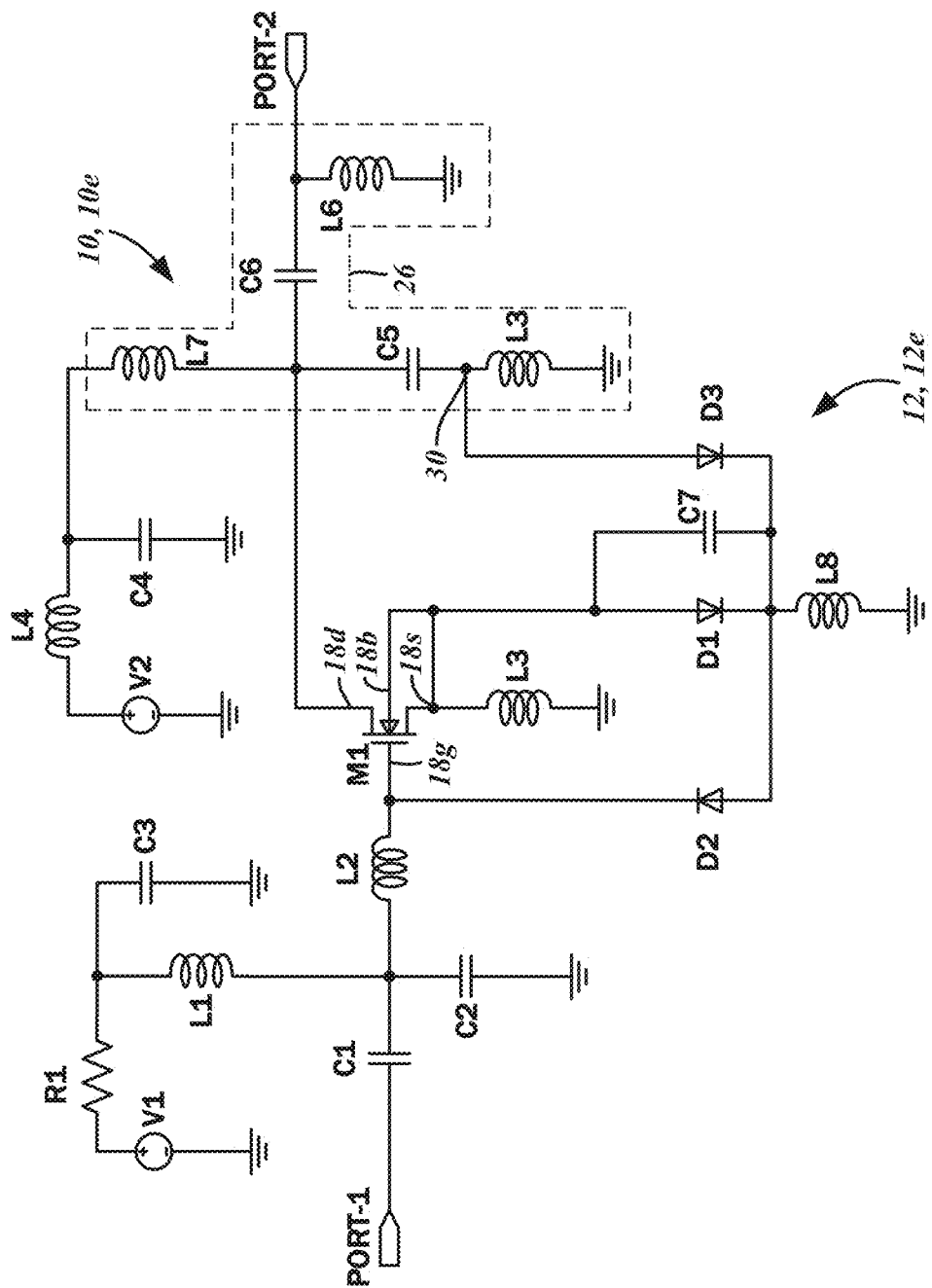
FIG. 13 is a schematic diagram of a fifth embodiment of the RF power amplifier with a fifth variant of the diode linearizer.

The schematic diagram of FIG. 13 illustrates a fifth embodiment of the RF power amplifier circuit 10e including a fifth embodiment of the diode linearizer circuit 12e. The basic components of the RF power amplifier circuit 10e, that is, the single stage amplifier transistor M1, along with the input matching circuit, output matching circuit, the control voltage circuit, and the bias circuit are the same as in the first, second, third, and fourth embodiments of the RF power amplifier circuit 10a, 10b, 10c, and 10d described above.

The fifth embodiment of the diode linearizer circuit 12e is almost the same as the fourth embodiment 12d, including the first diode D1 that is connected to the source terminal 18s of the transistor M1, the second diode D2 that is connected to the first diode D1 and to the gate terminal 18g of the first transistor M1, and the third diode D3 that is connected to the junction 30 of the output matching circuit 26 and to the first diode D1, the second diode D2, and the inductor L8. Again, the first diode D1, the second diode D2 and the third diode D3 may each have different geometric dimensions/sizes. This embodiment contemplates, however, an additional capacitor C7 connected across the first diode D1.

Figure 14:
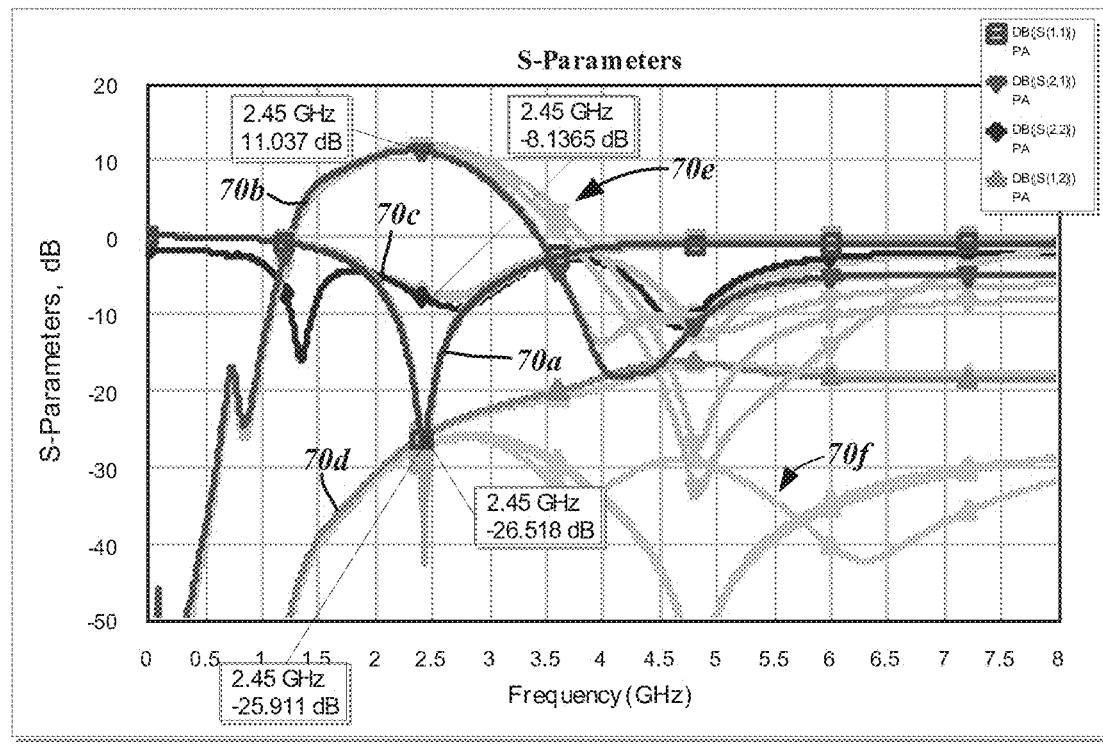
FIG. 14 is a graph plotting the S-parameters of the fifth embodiment of the RF power amplifier with the diode linearizer depicted in FIG. 13.

The graph of FIG. 14 plots simulated small-signal S-parameters versus frequency of the fifth embodiment of the RF power amplifier circuit 10e, with particular focus on the 2.4 GHz ISM band. A first plot 70a shows an input port return loss (S11), and a second plot 70b shows the amplifier gain (S21). A third plot 70c shows the output port return loss (S22), and a fourth plot 70d shows the reverse isolation (S12). There is a substantial difference in small signal S-parameters at frequencies above the operating band with the configuration of the fifth embodiment of the diode linearizer circuit 12e described above, e.g., by including the capacitor C7. In this simulation, the impedance of the input port 14 is selected to be 35 Ohm, while the capacitance value of the capacitor C7 is set to 0.3 pF. Comparison plots 70e show the amplifier gain (S21) of the first, second, third and fourth embodiments of the RF power amplifier circuit 10a-10d as described above. Similarly, another set of comparison plots 70f show the reverse isolation S12 of the first, second, third, and fourth embodiments of the RF power amplifier circuit 10a-10d.

Figure 15:
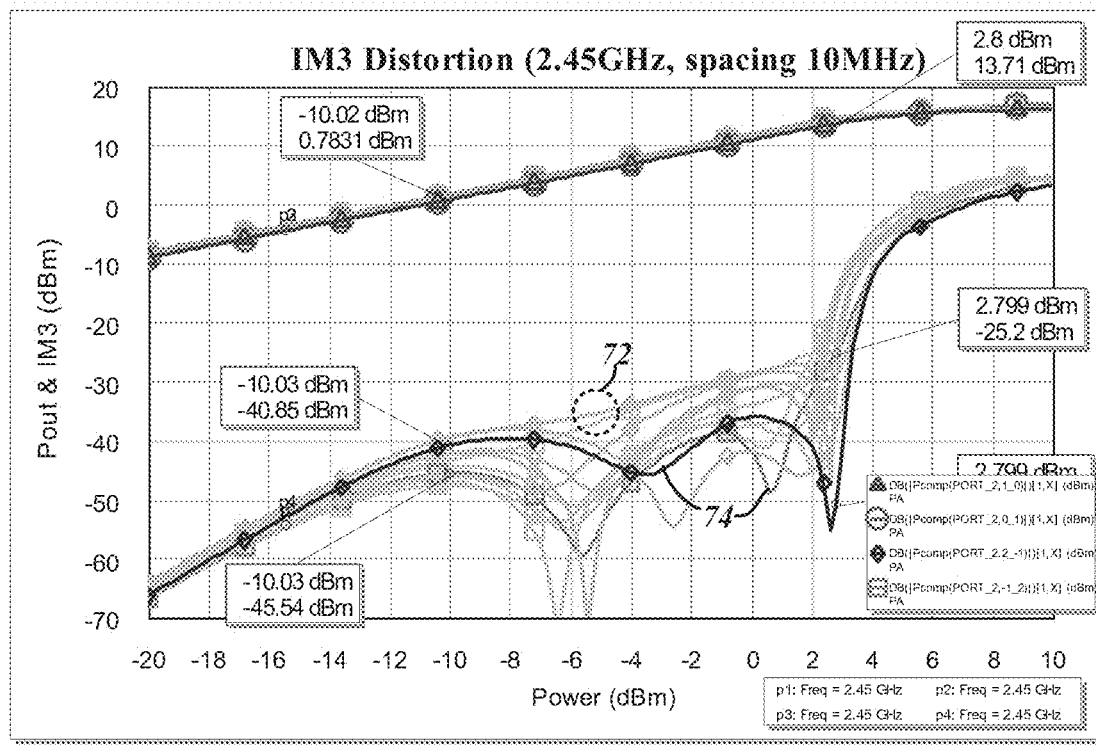
FIG. 15 is a graph plotting IM3 distortion of the fifth embodiment of the RF power amplifier with the diode linearizer depicted in FIG. 13.

FIG. 15 is a graph plotting the simulated IM3 distortion at the 2.4 GHz ISM frequency band over a range of input power for the fifth embodiment of the RF power amplifier circuit 10e including the fifth embodiment of the diode linearizer circuit 12e. A first plot 72 shows the IM3 products without the diode linearizer circuit 12e. A series of plots 74 show a substantial reduction of IM3 products over a wide range of input power levels at the input port 14 when the first diode D1, the second diode D2, and the third diode D3 are utilized. In these examples, the impedance of the input port 14 was 35 Ohm. Again, the shape and level of IM3 products are understood to be different between just the first diode D1, both the first diode D1 and the second diode D2, all three of the first diode D1, the second diode D2, and the third diode D3, and the further inclusion of the capacitor C7 to the first diode D1, the second diode D2, and the third diode D3. Additional fine-tuning for particular power ranges is possible with the selection of different diode sizes.

Figure 16:
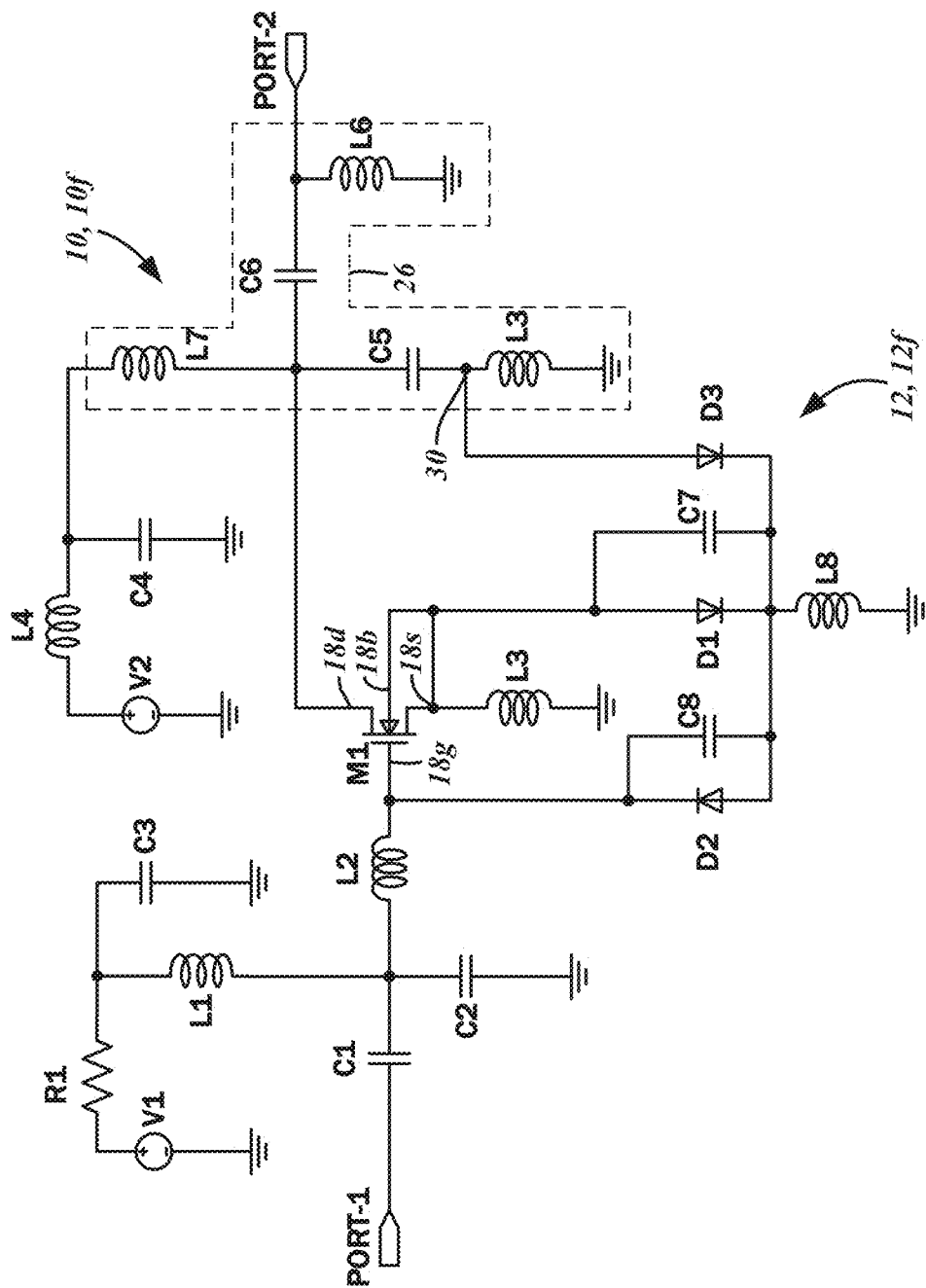
FIG. 16 is a schematic diagram of a sixth embodiment of the RF power amplifier with a sixth variant of the diode linearizer.

FIG. 16 is a schematic diagram showing a sixth embodiment of the RF power amplifier circuit 10f including a sixth embodiment of the diode linearizer circuit 12f. The basic components of the RF power amplifier circuit 10f, that is, the single stage amplifier transistor M1, along with the input matching circuit, output matching circuit, the control voltage circuit, and the bias circuit are the same as in the first, second, third, fourth, and fifth embodiments of the RF power amplifier circuit 10a, 10b, 10c, 10d, and 10e described above.

The sixth embodiment of the diode linearizer circuit 12f is almost the same as the fifth embodiment 12e, including the first diode D1 that is connected to the source terminal 18s of the transistor M1, the second diode D2 that is connected to the first diode D1 and to the gate terminal 18g of the first transistor M1, and the third diode D3 that is connected to the junction 30 of the output matching circuit 26 and to the first diode D1, the second diode D2, and the inductor L8. Additionally, there is the additional capacitor C7 that is connected across the first diode D7 in parallel. Again, the first diode D1, the second diode D2 and the third diode D3 may each have different geometric dimensions/sizes. This embodiment contemplates, however, still an additional capacitor C8 connected across the second diode D2 in parallel.

Figure 17:
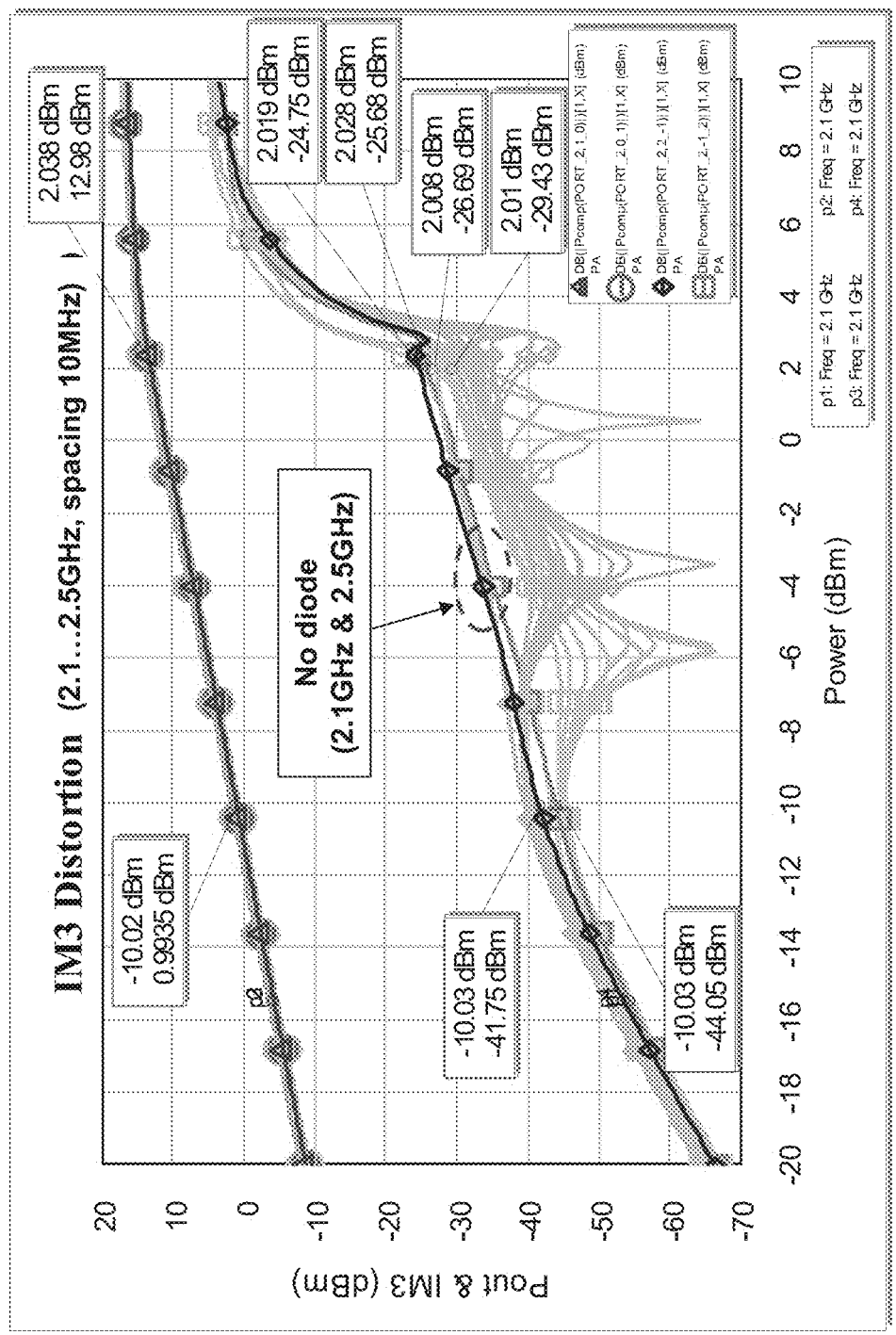
FIG. 17 is a graph plotting IM3 distortion of the sixth embodiment of the RF power amplifier with the diode linearizer depicted in FIG. 16.

FIG. 17 is a graph plotting the simulated IM3 distortion at the 2.4 GHz ISM frequency band over a range of input power for the sixth embodiment of the RF power amplifier circuit 10f including the sixth embodiment of the diode linearizer circuit 12f. The IM3 products are simulated at 2.1 GHz through 2.5 GHz in 50 MHz steps, while the tone spacing is set at 10 MHz. The capacitor C7 as shown above has been set with a value of 0.3 pF, while the capacitor C8 has been set with a value of 0.1 pF. With the diodes, the impedance of the input port 14 is 35 Ohm. As shown in the graph, different component values and diode sizes may achieve linear operation.

The various embodiments of the RF power amplifier circuit 10, and specifically the diode linearizer circuit 12 incorporated therein in accordance with the present disclosure, can decrease the EVM floor by 3 to 6 dB over a wide frequency band and power range in CMOS-based class F, class Inverse F, and class E amplifiers. Further reduction of EVM of up to 10 dB may be possible via the fine tuning of the component values by those having ordinary skill in the art. The diode linearizer circuit 12 disclosed incorporate diodes that are inserted in feed-back and feed-forward chains of the power amplifier circuit, and all embodiments contemplate diodes that are connected to the source or emitter of the RF power amplifier transistor. The nonlinear current-voltage characteristics as well as the nonlinear capacitance characteristics of the diodes are utilized to achieve these ends.

The particulars shown herein are by way of example and for purposes of illustrative discussion of the embodiments of the power amplifier circuits and the diode linearizer circuits only and are presented in the cause of providing what is believed to be the most useful and readily understood description of the principles and conceptual aspects. Different types of diodes, including those based on the CMOS transistors of the power amplifier, may be used. Furthermore, additional capacitors can be incorporated for further fine tuning of performance. The disclosed diode linearizers may be utilized in other classes of RF power amplifiers, and be incorporated into a multi-stage power amplifiers at different stages. In this regard, no attempt is made to show details with more particularity than is necessary, the description taken with the drawings making apparent to those skilled in the art how the several forms of the present disclosure may be embodied in practice.

What is claimed is:

1. A radio frequency (RF) power amplifier circuit with an input and an output comprising:
    a power amplifier transistor having a first terminal connected to the input, a second terminal connected to the output, and a third terminal; and
    a linearizer circuit connected to the third terminal and to ground, the linearizer circuit having a non-linear current-voltage curve and a non-linear capacitance, the linearizer circuit being tuned to reduce inter-modulation products in a current through the power amplifier transistor from the second terminal to the third terminal that corresponds to an input signal applied to the input,
    wherein the third terminal of the power amplifier transistor is connected to a first inductor tied to the ground, the first inductor being in parallel with the linearizer circuit.

2. The radio frequency power amplifier circuit of claim 1 wherein the first inductor is a bond wire.

3. The radio frequency power amplifier circuit of claim 1 wherein the linearizer circuit includes a first diode connected in series with a second inductor, and a voltage is induced across the linearizer circuit and the first inductor in response to the input signal applied to the first terminal of the power amplifier transistor.

4. The radio frequency power amplifier circuit of claim 3 wherein a degree of reduction in the inter-modulation products in the current through the power amplifier transistor is related to a size of the first diode.

5. The radio frequency power amplifier circuit of claim 4 wherein the first diode is defined by a cathode and an anode, the cathode being connected to the second inductor and the anode being connected to the third terminal of the power amplifier transistor.

6. The radio frequency power amplifier circuit of claim 3 wherein the linearizer circuit includes a second diode connected in anti-parallel with the first diode and in series with the second inductor.

7. The radio frequency power amplifier circuit of claim 6 wherein the first diode and the second diode each include a cathode and an anode, the anode of the first diode and the cathode of the second diode being connected to the third terminal of the power amplifier transistor, and the cathode of the first diode and the anode of the second diode being connected to the second inductor.

8. The radio frequency power amplifier circuit of claim 6 wherein the first diode and the second diode have different sizes.

9. The radio frequency power amplifier circuit of claim 1 wherein the power amplifier transistor is an n-type metal oxide semiconductor transistor, the first terminal being a gate, the second terminal being a drain, and a third terminal being a source, the third terminal being connected to a body of the power amplifier transistor.

10. The radio frequency power amplifier circuit of claim 1 further comprising an input matching circuit connected to the input and the first terminal of the power amplifier transistor, and an output matching circuit connected to the output and the second terminal of the power amplifier transistor.

11. The radio frequency power amplifier circuit of claim 1 further comprising a control voltage source connected to the first terminal of the power amplifier transistor and defining a bias point thereof.

12. The radio frequency power amplifier circuit of claim 1 further comprising a bias voltage source connected to the second terminal of the power amplifier transistor.

13. The radio frequency power amplifier circuit of claim 1 further comprising an output matching circuit connected to the output and the second terminal of the power amplifier transistor, and the linearizer circuit includes a second inductor connected to ground, a first diode connected in series with the second inductor and to the third terminal of the power amplifier transistor, a second diode connected in anti-parallel with the first diode and in series with the second inductor, and a third diode connected to the second inductor and to a node of the output matching circuit.

14. The radio frequency power amplifier circuit of claim 13 wherein the first diode, the second diode, and the third diode each include a cathode and an anode, the anode of the first diode and the cathode of the second diode is connected to the third terminal of the power amplifier transistor, the cathode of the first diode, the anode of the second diode, and the cathode of the third diode are connected to the second inductor.

15. The radio frequency power amplifier circuit of claim 13 wherein the first diode, the second diode, and the third diode have different sizes.

16. The radio frequency power amplifier circuit of claim 1 further comprising an input matching circuit connected to the input and the first terminal of the power amplifier transistor, and an output matching circuit connected to the output and the second terminal of the power amplifier transistor, the linearizer circuit including a second inductor connected to ground, a first diode connected in series with the second inductor and to the third terminal of the power amplifier transistor, a second diode connected to a node of the input matching circuit and to the second inductor, and a third diode connected to the second inductor and to a node of the output matching circuit.

17. The radio frequency power amplifier circuit of claim 16 wherein the first diode, the second diode, and the third diode each include a cathode and an anode, the anode of the first diode is connected to the third terminal of the power amplifier transistor, the cathode of the first diode, the anode of the second diode, and the cathode of the third diode are connected to the second inductor, the cathode of the second diode is connected to the node of the input matching circuit, and the anode of the third transistor is connected to the node of the output matching circuit.

18. The radio frequency power amplifier circuit of claim 16 wherein the first diode, the second diode, and the third diode have different sizes.

19. The radio frequency power amplifier circuit of claim 16 wherein the linearizer circuit includes a first capacitor connected in parallel to the first diode.

20. The radio frequency power amplifier circuit of claim 19 wherein the linearizer circuit includes a second capacitor connected in parallel to the second diode.

21. A radio frequency power amplifier circuit with an input and an output comprising:
a power amplifier transistor having a first terminal connected to the input, a second terminal connected to the output, and a third terminal; and
a linearizer circuit connected to the third terminal and to ground, the linearizer circuit having a non-linear current-voltage curve and a non-linear capacitance and including a first diode defined by a cathode and an anode, the anode being connected to the third terminal of the power amplifier transistor, the linearizer circuit being tuned to reduce inter-modulation products in a current through the power amplifier transistor from the second terminal to the third terminal that corresponds to an input signal applied to the input,
wherein the third terminal of the power amplifier transistor is connected to a first inductor tied to the ground, the first inductor being in parallel with the linearizer circuit.

22. A radio frequency power amplifier circuit with an input and an output comprising:
a power amplifier transistor having a first terminal connected to the input, a second terminal connected to the output, and a third terminal; and
a linearizer circuit connected to the third terminal and to ground, the linearizer circuit having a non-linear current-voltage curve and a non-linear capacitance and including a first diode defined by a cathode and an anode without any bias voltage applied therebetween, the linearizer circuit being tuned to reduce inter-modulation products in a current through the power amplifier transistor from the second terminal to the third terminal that corresponds to an input signal applied to the input,
wherein the third terminal of the power amplifier transistor is connected to a first inductor tied to the ground, the first inductor being in parallel with the linearizer circuit.

* * * * *